(12) United States Patent
Gavish et al.

(10) Patent No.: US 7,171,918 B2
(45) Date of Patent: Feb. 6, 2007

(54) FOCUSED ION BEAM DEPOSITION

(75) Inventors: Ilan Gavish, Kamiel (IL); Yuval Greenzweig, Ramat Hasharon (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/209,453

(22) Filed: Jul. 30, 2002

(65) Prior Publication Data
US 2002/0197851 A1 Dec. 26, 2002
US 2006/0252255 A9 Nov. 9, 2006

Related U.S. Application Data

(60) Division of application No. 09/753,108, filed on Dec. 30, 2000, now Pat. No. 6,492,261, and a continuation-in-part of application No. 09/752,492, filed on Dec. 29, 2000, now Pat. No. 6,638,580.

(51) Int. Cl.
C23C 16/00 (2006.01)
(52) U.S. Cl. .................................. 118/723 FI
(58) Field of Classification Search ............ 118/723 FI
See application file for complete search history.

(56) References Cited

U.S. PATENT DOCUMENTS

| | | | |
|---|---|---|---|
| 4,489,478 A * | 12/1984 | Sakurai ..................... | 438/18 |
| 4,800,173 A | 1/1989 | Kanai et al. | |
| 4,853,341 A | 8/1989 | Nishioka et al. | |
| 4,873,413 A * | 10/1989 | Uesugi et al. ......... | 219/121.68 |
| 4,876,112 A | 10/1989 | Kaito et al. | |
| 4,900,695 A * | 2/1990 | Takahashi et al. .......... | 438/625 |
| 4,908,226 A | 3/1990 | Kubena et al. | |
| 4,952,421 A | 8/1990 | Morimoto et al. | |
| 4,962,059 A | 10/1990 | Nishioka et al. | |
| 4,983,540 A * | 1/1991 | Yamaguchi et al. .......... | 438/10 |
| 4,993,361 A | 2/1991 | Unvala | |
| 5,026,664 A * | 6/1991 | Hongo et al. ............... | 438/625 |
| 5,104,684 A | 4/1992 | Tao et al. | |
| 5,106,764 A | 4/1992 | Harriott et al. | |
| 5,120,925 A | 6/1992 | Ohnishi et al. | |
| 5,132,248 A | 7/1992 | Drummond et al. | |
| 5,182,170 A | 1/1993 | Marcus et al. | |
| 5,182,231 A * | 1/1993 | Hongo et al. ............... | 438/598 |
| 5,230,756 A | 7/1993 | Kawasaki et al. | |
| 5,244,828 A * | 9/1993 | Okada et al. ............... | 438/479 |
| 5,342,448 A * | 8/1994 | Hamamura et al. ..... | 118/723 FI |
| 5,451,260 A * | 9/1995 | Versteeg et al. ............ | 118/725 |
| 5,500,289 A | 3/1996 | Gavish et al. | |
| 5,640,667 A | 6/1997 | Freitag et al. | |
| 5,700,526 A | 12/1997 | Ximen et al. | |
| 5,827,571 A | 10/1998 | Lee et al. | |

(Continued)

OTHER PUBLICATIONS

Vossen, Thin Film Processes II, Academic Press, 1991, pp. 642 and 643.*

*Primary Examiner*—Richard Bueker
(74) *Attorney, Agent, or Firm*—Blakely, Sokoloff, Taylor & Zafman LLP

(57) ABSTRACT

Introducing at least one metal such as cobalt, molybdenum, metal carbonyl, tungsten, platinum, or other suitable metal to a focused ion beam. Introducing the focused ion beam to a substrate within a processing chamber. Forming at least one layer over a substrate. Applying heat to the layer by, for example, a laser.

6 Claims, 3 Drawing Sheets

U.S. PATENT DOCUMENTS

| | | |
|---|---|---|
| 5,976,328 A | 11/1999 | Azuma et al. |
| 6,066,358 A * | 5/2000 | Guo et al. .................... 427/99 |
| 6,090,458 A * | 7/2000 | Murakami ................. 427/586 |
| 6,261,850 B1 | 7/2001 | Marsh |
| 6,309,798 B1 | 10/2001 | Reetz et al. |
| 6,322,672 B1 | 11/2001 | Shuman et al. |
| 6,376,148 B1 | 4/2002 | Liu et al. |
| 6,534,133 B1 | 3/2003 | Kaloyeros et al. |
| 6,638,580 B2 | 10/2003 | Gavish |
| 6,660,631 B1 | 12/2003 | Marsh |
| 2001/0044207 A1 | 11/2001 | Marsh |
| 2001/0045525 A1 | 11/2001 | Gerlach et al. |
| 2002/0197851 A1 | 12/2002 | Gavish et al. |

* cited by examiner

FOCUSED ION BEAM DEPOSITION

RELATED APPLICATION

This Application is a Continuation-In-Part of U.S. patent application Ser. No. 09/752,492 filed Dec. 29, 2000 (now issued as U.S. Pat. No. 6,638,580 B2 on Oct. 28, 2003 to Gavish) which is a co-pending application with the current Application. This application is also a divisional of U.S. patent application, Ser. No. 09/753,108, filed Dec. 30, 2000 (now issued as U.S. Pat. No. 6,492,261 on Dec. 10, 2002 to Gavish et al.).

BACKGROUND OF THE INVENTION

1. Field of the Invention

The invention relates generally to post-processing with heat of focused ion beam deposited "metal lines" or layers, and the resultant reduction of the metal line or layer's electrical resistance.

2. Background

Integrated circuit structures are generally formed of numerous discrete devices on a semiconductor chip such as a silicon semiconductor chip. The individual devices are interconnected in appropriate patterns to one another and to external devices through the use of interconnection lines or interconnects to form an integrated device. Typically, many integrated circuit devices are formed on a single structure, such as a wafer substrate and, once formed, are separated into individual chips or dies for use in various environments.

There are several conventional processes for introducing metals such as aluminum, an aluminum alloy, or platinum to form an interconnect onto a substrate. The metal is generally introduced in the form of a deposition process, (e.g., chemical vapor deposition (CVD)) and patterned by way of an etching process into a discrete line or lines. Another process for introducing a metal interconnect, particularly copper or its alloys over a substrate is the damascene process. The damascene process introduces copper interconnect according to a desired pattern previously formed in dielectric material over a substrate.

Yet another process is FIB metal deposition that is generally used to introduce thin metal lines or arbitrary patterns as a layer over a substrate. FIB deposition is used for modification of small metallic structures such as the modification of existing interconnects in integrated circuits. In the FIB, a gaseous metal-organic precursor containing metal (e.g. platinum, tungsten etc.) is introduced over a substrate. The ion beam contacts the gaseous metal-organic precursor causing the dissociation of the precursor and the release of metal atoms. The metal atoms then form a metal line or layer over the substrate.

One disadvantage of FIB metal line deposition is that the material that is formed is impure, and typically has a high (in comparison to process lines) electrical resistance such as 160 micro Ohm centimeters (micro Ohm cm) to 200 micro Ohm cm. What is needed is a process and a tool that allows for the introduction of metals to form a layer over a substrate that is both efficient and decreases the electrical resistance of the FIB interconnect.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION OF THE INVENTION

In one embodiment, a method includes introducing at least one metal precursor to a focused ion beam (FIB), forming at least one metal (or alloy) layer over a substrate, and applying heat to the layer in order to reduce the resistance of that layer. The metal may include cobalt, molybdenum, tungsten, platinum, or a mixture of cobalt, molybdenum, tungsten or any other suitable metal. In the context of the description of the invention, the words cobalt, molybdenum, platinum, or tungsten are intended to refer to both pure cobalt, molybdenum, platinum, or tungsten and to their alloys that are suitable as integrated circuit interconnect material.

In another aspect, a system is disclosed for FIB introduction of a metal or metals over a substrate to form a layer on the substrate and thereafter, heat is applied to that layer. Heating the layer reduces the resistance of that layer. In one embodiment, the system includes a chamber configured to house a substrate, such as a semiconductor wafer, a discrete chip or a die, and an energy source. A system controller is configured to control the introduction of a metal precursor such as a metal carbonyl, where the metal may be cobalt, molybdenum, platinum, tungsten, or a mixture of two or more of these metals into a FIB. The system controller also controls the deposition of the metals by controlling the ion beam scanning over a substrate. A memory coupled to the controller includes a machine-readable medium having a machine-readable program embodied therein for directing the operation of the system. The machine-readable program includes instructions for controlling the flow of metal precursor introduced to the substrate, and controlling the scanning of the ion beam to form the pattern of the metal layer. Additionally, the machine readable program includes instructions for controlling the amount of power and its special distribution applied by a laser or other power source to heat a layer of metal(s) formed over the substrate. In the discussion that follows, FIG. 1 illustrates FIB deposition system 103 for FIB deposition and FIGS. 2–5 illustrate the formation of layers over a substrate and the formation of heated areas on the layers.

Figure 1:
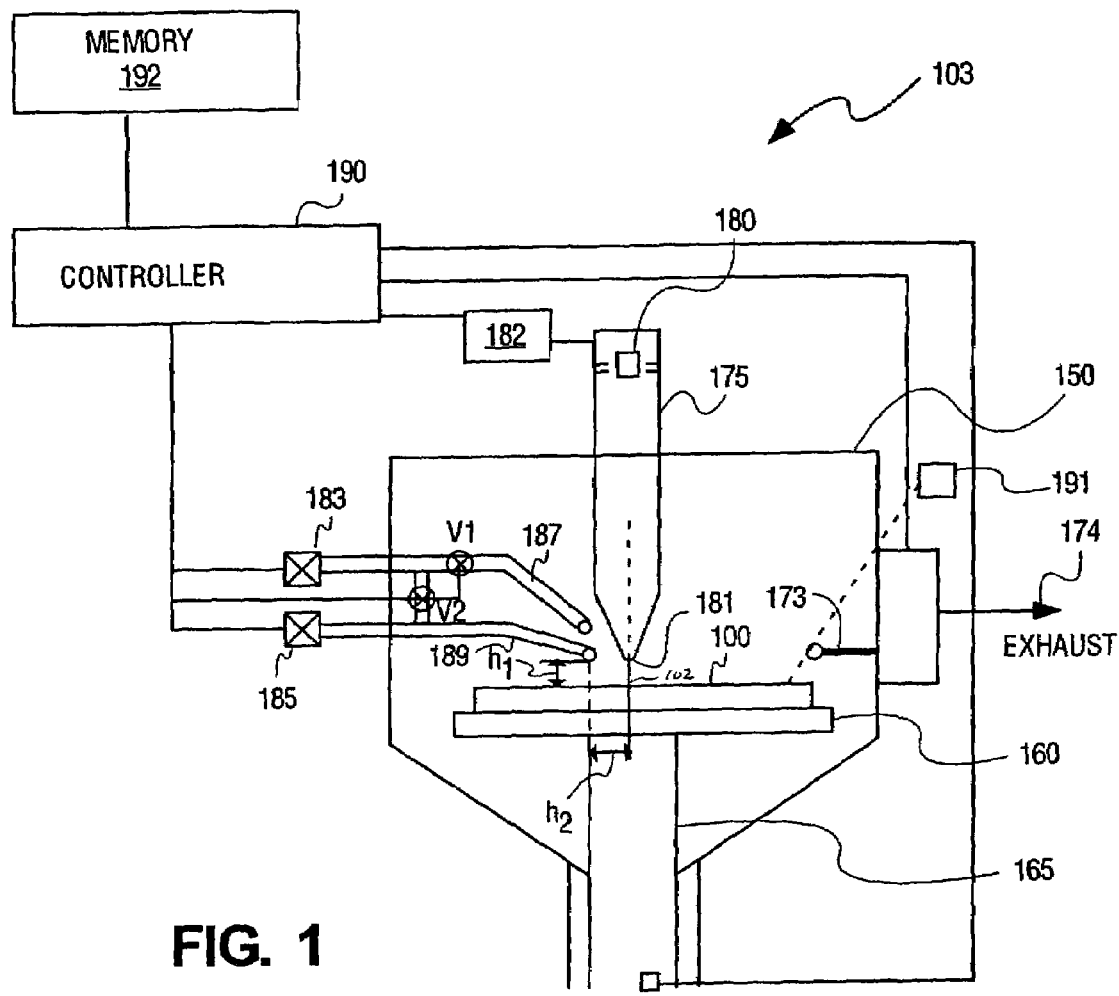
FIG. 1 illustrates a schematic cross-sectional view of a processing chamber suitable for performing the modification described in reference to FIGS. 2–5 in accordance with one embodiment of the invention.

FIG. 1 illustrates a schematic cross-sectional view of a FIB deposition system 103 that is used to introduce a metal or metals over substrate 100 to form a layer over substrate 100 and heat the layer or a discrete area of the layer to reduce the resistance in the layer. FIB deposition system 103 includes chamber 150, first and second reservoirs (183, 185), FIB column 175, heat source 191, and controller 190 for FIB deposition of metals such as cobalt, molybdenum, platinum, tungsten or other suitable metals over substrate 100. Each of these devices is described below.

Chamber 150 is typically constructed of aluminum or steel and has a suitable inside volume to house a substrate, such as substrate 100. Substrate 100 may be a piece of silicon coated by a layer 1 micron thick of silicon dioxide or any electrically insulating substrate. In FIG. 1, substrate 100 is seated on substrate processing stage 160 that itself is coupled to shaft 165 to support stage 160 inside chamber 150.

Coupled to chamber 150 is first reservoir 183 and second reservoir 185. First reservoir 183 and second reservoir 185 are configured to contain different metal precursors for their delivery to chamber 150 in, for example, a metal carbonyl. Many metals have gaseous precursors that have molecules composed of a metal atom (or atoms) chemically bonded to a lighter radical—frequently organic—which enables the composite material to be in the gaseous phase in vacuum levels typical of FIBs such as ($10^{-6}$ torr).

First inlet 187 connected to first reservoir 183 and second inlet 189 connected to second reservoir 185 are configured to release the metal precursor at the working area of the ion beam over substrate 100. In one embodiment, first inlet (e.g., nozzle) 187 and second inlet 189 should be positioned ($h_1$) approximately 100 microns from the surface of substrate 100 and approximately 100 microns from the center of FIB column 175, or the center of the working area of the ion beam. FIG. 1 also shows that first reservoir 183 and second reservoir 185 are connected to Controller 190. Controller 190 controls the addition of the metal precursors from first reservoir 183 and second reservoir 185 to chamber 150 and may automatically adjust first inlet 187 and second inlet 189. Absent automated process control, first inlet 187 and second inlet 189 may be positioned manually.

There are several methods for introducing one or more metal precursors to chamber 150. For example, at least one or more metal precursors is placed into the first or second reservoirs (183 and 185). At atmospheric pressure, the metal precursor(s) are solid. Once chamber 150 is pumped down to pressures as specified herein, one or more metal precursors begin to sublimate and to create a vapor. Upon opening of the appropriate valves such as $V_1$ or $V_2$ from first and second reservoirs (183, 185), the gaseous phase of metal precursor(s) flows through, for example, a single inlet such as first inlet 187 to chamber 150. A metal line or layer is then formed over substrate 100 after the ion beam contacts the metal precursor.

Another method is to introduce two metal precursors (e.g., tungsten hexacarbonyl, methylcyclopentadienyl trimethyl platinum, etc.) into first and second reservoirs (183 and 185) that enter chamber 150 through separate inlets such as first and second inlets (187 and 189). Another method involves using a single bi-metal precursor from a single reservoir, into chamber 150, and onto substrate 100.

Yet another method is to introduce two metal precursors such as $W(CO)_6$ and $Co_2(CO)_8$ into first and second reservoirs (183, 185) for injection of the metal precursors through a single inlet, such as first inlet 187, into chamber 150. The mixture of these two metal precursors is placed in the path of the ion beam and after the FIB contacts the metal precursors, a metal or a metal alloy layer is formed over substrate 100.

Once the metal precursor(s) flow starts reaching the working area 102 of the FIB system 103 on substrate 100 in the chamber 150, the ion beam may be activated in a raster (scanning) pattern that defines the shape of the box or pattern to be deposited on the sample. The ion beam is introduced through FIB column 175. FIB column 175 is coupled to chamber 150 and enters through a top surface of the otherwise sealed chamber. FIB column 175 includes an ion source 180 for introducing an ion species, including but not limited to a gallium source, and an acceleration voltage powered by a HV power supply 182 (e.g., 50 kilo-Volt (kV), 30 kV) for ionizing the source species and delivering the source species to the substrate. The current introduced is also regulated by FIB aperture(s) 181 inside the FIB column 175.

In one embodiment, FIB column 175 is a Micron 9800FC column produced by FEI Corporation of Hillsboro, Oreg. (www.feico.com). In another embodiment, FIB column 175 is an FEI FIB 200, produced by FEI. It is to be appreciated that other FIB columns may be similarly suitable.

Once the precursor molecules are adsorbed to the surface of substrate 100 and the FIB contacts the substrate, a layer such as an interconnect is formed over substrate 100. For example, FIB tungsten lines of width 8 microns, length 100 microns and height (thickness) 0.25 microns may be formed using techniques described herein. The width of 8 microns conforms to the typical minimum spot size of the laser and the optics used to heat the lines. It will be appreciated that the width of FIB tungsten lines may be much smaller than or greater than 8 microns. These lines are lines with a specific resistance of about 200 micro Ohm cm.

After the metal lines or layers have been formed over substrate 100, substrate 100 is either kept in chamber 150 or is placed within an evacuated chamber (e.g., a chamber of a lower grade vacuum e.g. ~1 torr). The heating of the FIB-deposited metal lines or layer may be performed in a low level vacuum of 1 torr, an atmosphere of non-reacting gas, a reducing atmosphere such as hydrogen or any other suitable atmosphere.

Heat is then applied to the layer over substrate 100 through heat source 191 in order to reduce the resistance of the layer. Heat source 191 may be external or internal to FIB deposition system 103. Heat source 191 may be, for example, a Light Amplification through Stimulated Emission of Radiation (laser), a continuous wave (CW)(not pulsed), a pulsed laser, an Argon Ion laser having most of its power in the wavelengths 514 and 488 nm, or any other suitable laser. A 5×lens of numerical aperture approximately 0.15 may be used with a resulting spot size of roughly 8–10 microns. Other objective lenses and resultant spot sizes may also be suitable.

Other options for heating include ovens, local heating by hot inert gas jets, a current forced through the metal line by an external power source, or other suitable heat sources. Other suitable heat sources include those heat source that cause a re-crystallization of the metal component of the FIB metal.

The amount of heat that must be applied to a layer is dependent, in part, upon the metal or metals of which the layer is composed. Generally, if a laser is used, a power density characterized by 0.3 to 5 watts applied to a spot of diameter 10 μm, with the higher power generally reserved for the more refractory elements, such as tungsten. If the metal line or layer comprises tungsten, the power of the laser should be about 4.5 W. In order to achieve an appropriate heat to be applied, the metal line(s) or layer(s) over substrate 100, one skilled in the art may adjust the laser power to obtain probable damage to substrate 100 before actually heating the metal line or layer. The power may then be adjusted to below the estimated heating value that may potentially cause damage to the metal line or layer. The stage speed may then be adjusted to about 50 μ/second range. It will be appreciated that the stage speed is in the range of about 0 to about 250 μ/second preferably; however, stage speeds greater than 250 μ/second may also be used. The lower the stage speed, the lower the power density that is typically required.

Heating of the metal line or layer by laser may be accomplished by fixing the laser beam and moving substrate 100 (by moving substrate processing stage 160), fixing both the laser beam and substrate 100, fixing the substrate 100 and scanning substrate 100 with the laser beam, or any other suitable method.

An example of effective parameters for a laser to heat a line thickness of about 0.25μ is a spot size width of 8 microns, a stage speed of 50 μ/second and a power value of 0.125 watt/micron$^2$. Such laser treatment has caused crystallization of tungsten and its transformation into polycrystalline tungsten as determined by transmission electron microscopy diffraction analysis. It has also caused the removal of carbon, oxygen, and residual source elements (e.g. gallium) as determined by Energy Dispersive Spectrometry and Auger analyses. The laser heating of the FIB-introduced metal layer may be performed in a low level vacuum of 1 torr, an atmosphere of non-reacting gas, or a reducing atmosphere such as hydrogen. After a particular area on the layer has been heated, the specific resistance of the layer may be as low as 10 micro Ohm cm to about 120 micro Ohm cm.

Coupled to chamber 150 is controller 190. Controller 190 includes a processor (not shown) and memory 192. Memory 192 includes instruction logic accessible by the processor to control the introduction of metal precursor(s) and the operation of the FIB. Memory 192 also includes instruction logic for applying heat to a layer formed over substrate 100.

Controller 190 may control a variety of other parameters. For example, controller 190 may control the movement of heat source 191 to heat areas on layers over substrate 100. Alternatively, substrate 100 of FIG. 1 itself may be moved to heat another discrete area on a layer. It is to be appreciated, however, that with a suitable heat source 191, an entire interconnect area may be heated at once.

Controller 190 also controls vacuum pump 173 to ensure gases generated in chamber 150 from heating a layer over substrate 100 are removed. In this embodiment, likely expelled gases such as carbon oxides are removed through pump 173, and exhaust 174. Other suitable instructions in controller 190 are used to control other applicable control parameters.

Figure 2:
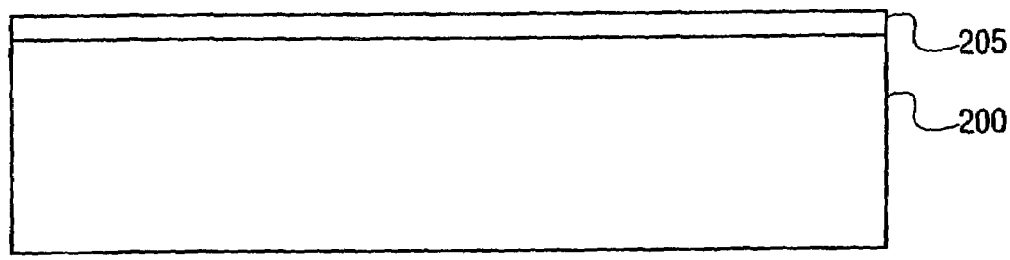
FIG. 2 illustrates a schematic cross-sectional view of a portion of a substrate in accordance with one embodiment of the invention.

Given the explanation of FIB deposition system 103, the description that follows in FIGS. 2 through 5 illustrates the formation of a structure of interconnects as part of a device in accordance with one embodiment of the invention. FIG. 2 illustrates a schematic cross-sectional view of a portion of typical semiconductor substrate or wafer 200 in accordance with one embodiment of the invention. Substrate 200 generally comprises silicon or other suitable material. Typically, substrate 200 includes a dielectric layer 205. Dielectric layer 205 may include materials such as silicon dioxide, silicon nitride, or other suitable material. Devices (e.g., transistors) and other material layers may also be formed on substrate 200 below dielectric layer 205.

Figure 3:
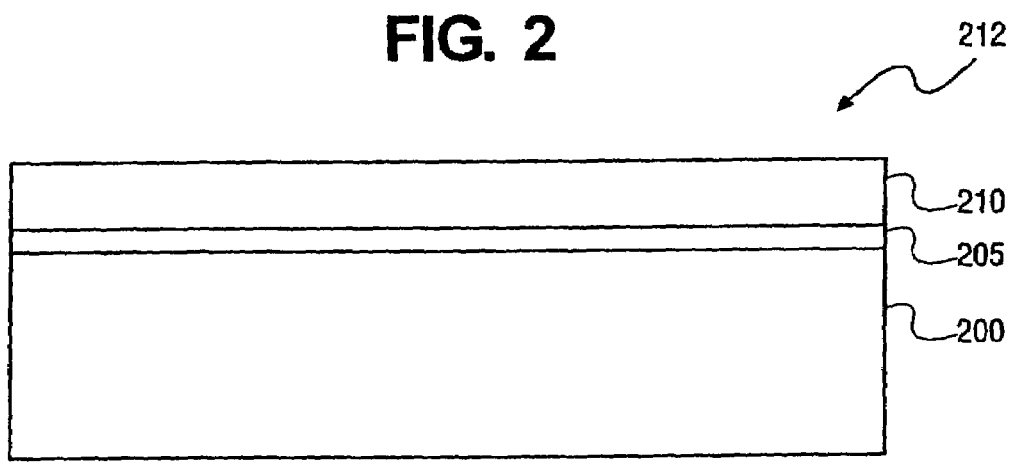
FIG. 3 illustrates a schematic cross-sectional view of a metal introduced onto the substrate of FIG. 2 in accordance with one embodiment of the invention.

FIG. 3 illustrates a schematic cross-sectional view of metals introduced onto substrate 200 illustrated in FIG. 2 using FIB deposition to form structure 212. At least one or more precursors of metals such as cobalt, molybdenum, platinum, tungsten or other suitable metal is introduced by a metal precursor in a gaseous phase to the chamber. The ion beam scans a layer thereby forming a FIB layer such as first layer 210. First layer 210 may include one or more metals. In this embodiment, first layer 210 is an alloy that includes, for example, two metals such as cobalt and molybdenum that are introduced onto substrate 200 through FIB deposition. It will be appreciated that first layer 210 may also comprise any other selection of metals.

Figure 4:
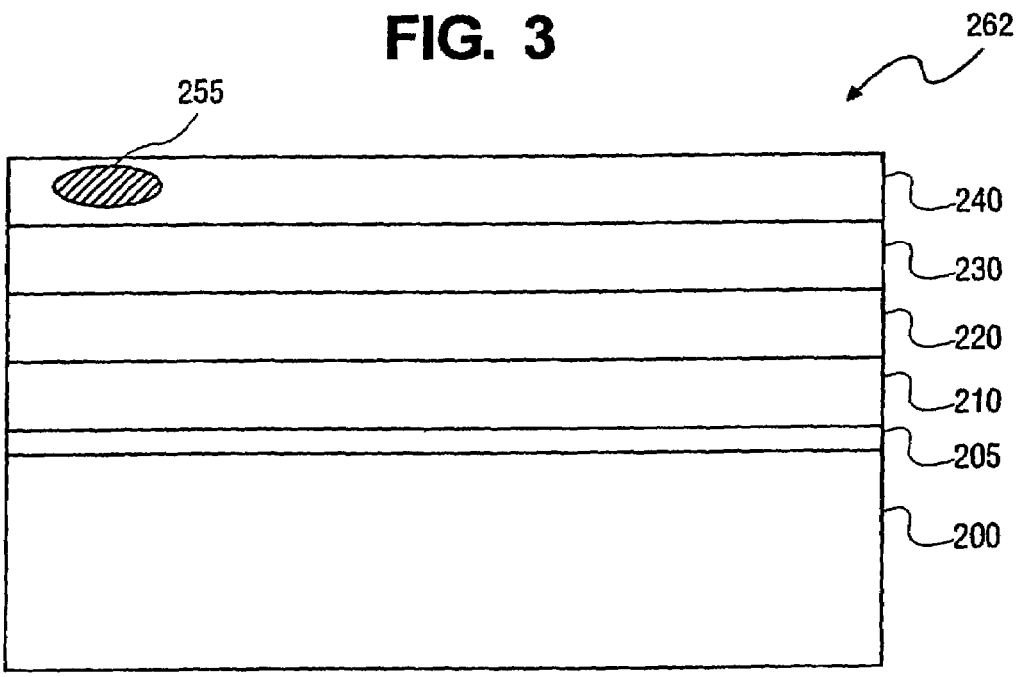
FIG. 4 illustrates a schematic cross-sectional view of a structure having multiple layers in which discrete areas are heated in accordance with one embodiment of the invention.

Additional layers may optionally be formed over first layer 210 as shown by second, third, and fourth layers (220, 230, 240) of structure 262 of FIG. 4 using techniques disclosed herein. Additional layers may include one or more metals such as cobalt, metal carbonyl, molybdenum, platinum, tungsten, or other suitable metals. For example, second layer 220 may include metals such as tungsten carbonyl and tungsten; third layer 230 may include metals such as cobalt and molybdenum; and fourth layer 240 may include metals such as tungsten and tungsten carbonyl. Moreover, the thickness of these layers may range from about 0.1 μm to about 0.3 μm. It will be appreciated that the thickness and composition of additional layers may be arbitrarily established by adjusting the parameters to FIB deposition system 103.

FIG. 4 further illustrates layers of structure 262 in which resistance of a layer is reduced by localized heating in accordance with one embodiment of the invention. Specifically, localized heating by using a laser produces first heated area 255. It will be appreciated that localized heating of discrete areas on fourth layer 240 over substrate 200 may be accomplished in a variety of ways. For example, the laser may heat a localized area on structure 262 at 0.3 watts to 5 watts in an area of 0.5 μm$^2$ to 800 μm$^2$. Other heat sources capable of heating a layer include local heating by inert hot gas jets, local ion scan bombardment, current forced through the layer by an external power source, or other suitable heat sources.

First heated area 255 is formed through top heating of fourth layer 240. Crystalline metal is formed at first heated area 255. A suitable amount of time to form first heated area 255 of structure 262 in FIG. 4 is in the range of about 500 to about 20,000 microseconds to heat a 0.1 to about 1 micron thick interconnect material in which the heat that is applied is about 0.3 to 5 watts. Heating of, for example, fourth layer 240 causes carbon and oxygen that may be present in this layer to be driven off, presumably as carbon monoxide and carbon dioxide. The resistance that is achieved in first heated area 255 is about in the range of 120 micro Ohm cm to about 10 micro Ohm cm. Consequently, structure 262 illustrated in FIG. 4 has a much lower resistance than the resistance found in conventional devices. It is appreciated that to lower the resistance of the metal line, the entire line need not be exposed to the heat treatment. Instead, the resistance of the line may be reduced by localized heating of a desired number of areas. Additionally, localized heating of discrete areas on other layers such as first, second, third, or fourth layers (210, 220, 230, 240) over substrate 200 may be accomplished by using a suitable heat source 191. For example, side heating of second layer 220 and third layer 230 may create a second heated area (not shown).

Figure 5:
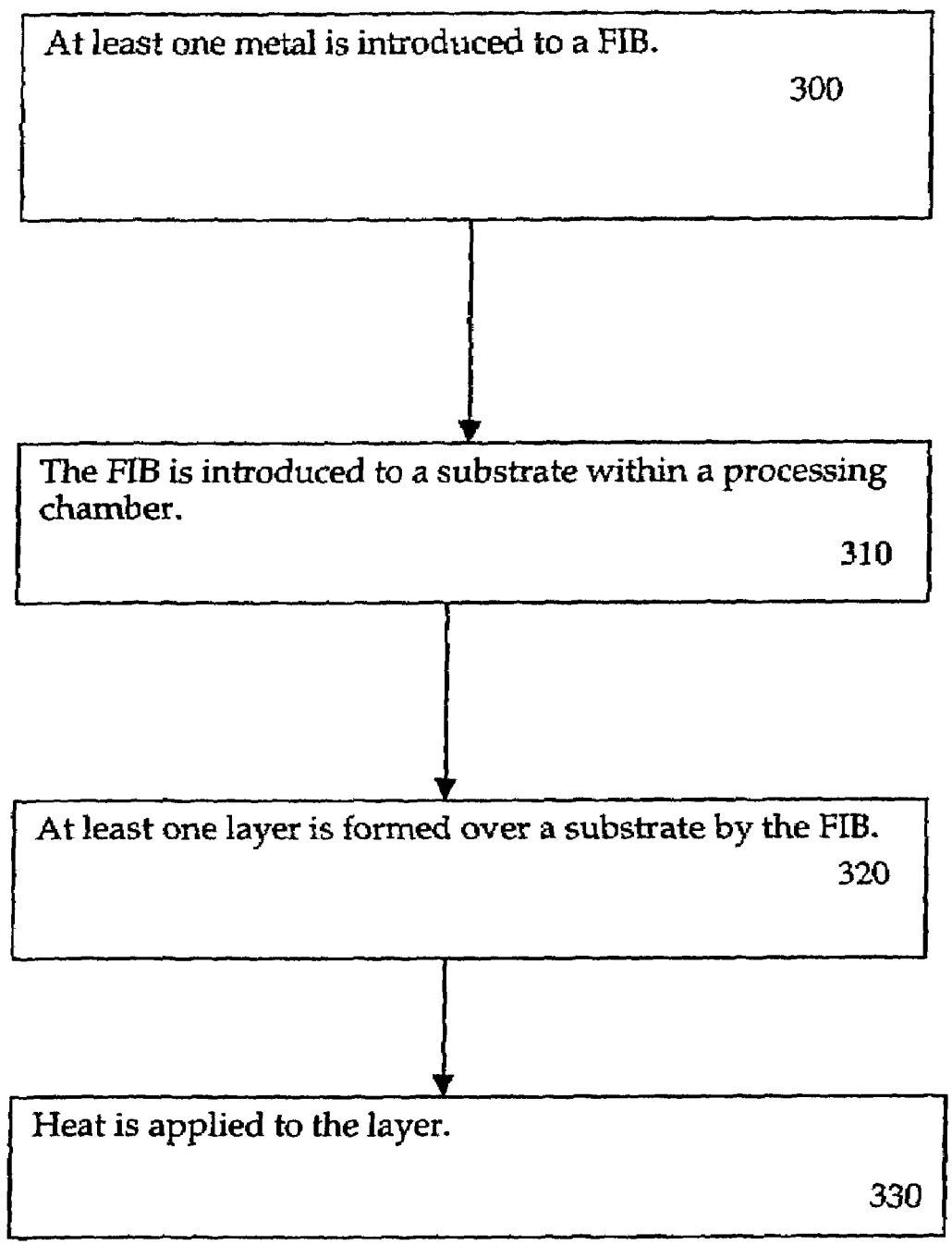
FIG. 5 illustrates a flow diagram of one method of focused ion beam deposition of a layer over a substrate and heating of the layer in accordance with one embodiment of the invention.

FIG. 5 illustrates a flow diagram of one method of FIB deposition of a layer over a substrate and heating of the layer in accordance with one embodiment of the invention. At block 300, at least one metal is introduced to a FIB. At block 310, the FIB is introduced to a substrate within a processing chamber. At block 320, at least one layer is formed over a substrate by the FIB. At block 330, heat is applied to the layer. Crystalline metal may be formed in the area that is heated. Crystalline metal is the more stable form of metal in its natural state.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A system comprising:
   a chamber configured to house a substrate for processing;
   an energy source coupled to the chamber;
   an ion beam source coupled to the chamber;
   at least one hot inert gas source coupled to the chamber for locally heating and crystallizing a layer formed by the ion beam source;
   a system controller configured to control the introduction of at least one metal containing precursor into a focused ion beam and to control the introduction of the focused ion beam powered from the energy source; and
   a memory coupled to the controller comprising a computer-readable medium having a computer-readable program embodied therein for directing operation of the system, the computer-readable program comprising:
   instructions for controlling the energy source and for introducing the at least one metal containing precursor into the focused ion beam which is introduced into the chamber over the substrate in which the at least one metal from the at least one metal containing precursor forms at least one layer over the substrate; and
   instructions for controlling said hot inert gas source to locally heat and crystallize the at least one layer.

2. The system of claim 1, wherein the at least one layer contains one of cobalt, layer carbonyl, molybdenum, platinum, and tungsten.

3. The system of claim 1, wherein the at least one metal containing precursor contains at least one of cobalt, metal carbonyl, molybdenum, platinum, and tungsten and is introduced into the focused ion beam at a chamber pressure in the range of $10^{-5}$ to $10^{-7}$ torr and about room temperature.

4. The system of claim 1, wherein the focused ion beam heats a discrete area on the layer.

5. The system of claim 4, wherein one of a carbon and an oxygen is removed from the layer.

6. The system of claim 1, wherein the program includes instructions for introducing into the focused ion beam a precursor containing at least two of cobalt, metal carbonyl, molybdenum, platinum, and tungsten in a controllable ratio.

* * * * *

UNITED STATES PATENT AND TRADEMARK OFFICE
CERTIFICATE OF CORRECTION

PATENT NO. : 7,171,918 B2 Page 1 of 1
APPLICATION NO. : 10/209453
DATED : February 6, 2007
INVENTOR(S) : Gavish et al.

It is certified that error appears in the above-identified patent and that said Letters Patent is hereby corrected as shown below:

Column 3, at line 31, delete the first occurrence of "Controller" and insert --controller--.

Signed and Sealed this

Eighth Day of April, 2008

JON W. DUDAS
*Director of the United States Patent and Trademark Office*